United States Patent [19]
Lin et al.

[11] Patent Number: 5,532,960
[45] Date of Patent: Jul. 2, 1996

[54] NEGATIVE VOLTAGE GENERATOR FOR FLASH EPROM DESIGN

[75] Inventors: Tien-Ler Lin, Cupertino, Calif.; Liang Chao, Hsinchu, Taiwan

[73] Assignee: Macronix International Co., Ltd., Hsinchu, Taiwan

[21] Appl. No.: 371,361

[22] Filed: Jan. 11, 1995

Related U.S. Application Data

[62] Division of Ser. No. 108,647, filed as PCT/US93/05133, May 28, 1993, Pat. No. 5,399,928.

[51] Int. Cl.[6] .................................................. G11C 7/00
[52] U.S. Cl. .............................. 365/185.29; 365/185.16; 365/218; 365/189.09
[58] Field of Search ................................ 365/185, 218, 365/900, 189.09, 185.16, 185.29; 327/434, 536, 589

[56] References Cited

U.S. PATENT DOCUMENTS

| | | | |
|---|---|---|---|
| 4,992,980 | 2/1991 | Park et al. | 365/104 |
| 5,077,691 | 12/1991 | Haddad et al. | 365/218 |
| 5,095,461 | 3/1992 | Miyakawa et al. | 365/185 |
| 5,222,040 | 6/1993 | Challa | 365/185 |
| 5,235,544 | 8/1993 | Caywood | 365/185 |
| 5,282,170 | 1/1994 | Van Buskirk et al. | 365/226 |
| 5,287,536 | 2/1994 | Schreck et al. | 365/230.06 |
| 5,321,653 | 6/1994 | Suh et al. | 365/189.09 |
| 5,329,168 | 7/1994 | Sugibayashi et al. | 307/296.1 |
| 5,399,891 | 3/1995 | Yiu et al. | 365/185 |
| 5,412,238 | 5/1995 | Chang | 365/185 |

FOREIGN PATENT DOCUMENTS

0525678A2  2/1993  European Pat. Off. .

*Primary Examiner*—Tan T. Nguyen
*Attorney, Agent, or Firm*—Haynes & Davis

[57] ABSTRACT

A circuit is provided for supplying a negative high voltage to an integrated circuit from a high positive voltage source $V_{PP}$. The negative voltage is applied to a plurality of FLASH electrically erasable programmable read only memory (EPROM) cells. The circuit includes an oscillator coupled to a voltage converter which provides a periodic signal. The periodic signal is coupled to a charge pump including three P-channel type transistors to produce the negative voltage. The source and drain of the first transistor is coupled to the periodic signal. The second transistor's gate and drain is coupled to a reference ground potential with the source coupled to the first transistor's gate. Finally, the third transistor's drain and gate is coupled to the first transistor's gate and the third transistor's source outputs negative voltage to floating gates of the plurality of FLASH EPROM cells during an erase operation. Further, the negative voltage generated is relatively precise, so no regulation is required.

13 Claims, 6 Drawing Sheets

NEGATIVE VOLTAGE GENERATOR FOR FLASH EPROM DESIGN

This application is a divisional of application Ser. No. 08/108,647, filed as PCT/US93/05133, May 28, 1993 now U.S. Pat. No. 5,399,928.

CROSS-REFERENCE TO RELATED APPLICATIONS

The present application is related to co-pending U.S. patent application entitled NON-VOLATILE MEMORY CELL AND ARRAY ARCHITECTURE, Ser. No. 07/823,882, filed Jan. 22, 1992, which was owned at the time of invention and is currently owned by the same assignee.

BACKGROUND OF THE INVENTION

1. Field of the Invention

The present invention relates to negative voltage generators responsive to positive voltage power supplies, and more particularly, to providing high negative voltages in integrated circuits such as FLASH EPROM memory devices.

2. Description of Related Art

Different levels of internal voltage are required during various modes of operation of FLASH EPROM (electrically programmable read only memory) integrated circuits for electrically erasing, programing or reading a memory cell. The memory cells in FLASH EPROM are formed using so-called floating gate transistors in which the data is stored by charging or discharging the floating gate.

The act of charging the floating gate is termed the program mode for a FLASH EPROM. This is typically accomplished using hot electron injection induced by establishing a large positive voltage between the gate and source, as much as 12 volts, and a positive voltage between the drain and source, for instance, 7 volts.

The act of discharging the floating gate is called the erase mode for a FLASH EPROM. This erase function is typically carried out through Fowler-Nordheim tunneling induced by establishing a large positive voltage from the source to gate, while floating the drain of the memory cell. This positive voltage can be as much as 12 volts.

However, when applying 12 volts to the source and grounding the gate, very high reverse voltage is developed between source and substrate, the generation of hot holes is increased, and the memory cell may exhibit "hot hole trapping." Hot hole trapping degrades endurance cycling performance of the device.

In order to alleviate hot hole trapping during an erase operation, a negative voltage may be applied to the gate of the memory cell. Instead of applying 12 volts to the source and grounding the gate, a large negative voltage, such as less then −7.5 volts, may be applied to the gate and a lower positive voltage may be applied to the source, for example, 7.0 volts. Thus, much lower voltages are developed between the source and substrate and hot hole generation is suppressed.

However, FLASH EPROM memory is typically supplied with two external positive power sources rather than a negative power supply. The first positive power source, $V_{DD}$, is applied at power up and is typically used during the read operation. $V_{DD}$ is usually 5.0±0.5 volts. The second positive power source, $V_{PP}$, is typically applied during program or erase mode, and is typically 12.0±0.6 volts. Therefore, in order to supply negative voltage to the EPROM cells, a relatively large negative voltage must be generated from either of the two positive power supplies.

Therefore, it is desirable to provide a circuit used in supplying a relatively precise high negative voltage without regulation, to FLASH EPROM memory cells, or other environments relying on positive power supplies from a positive power supply.

SUMMARY OF THE INVENTION

The present invention provides a circuit for generating negative voltage in an integrated circuit, in response to a positive voltage source. In particular, a FLASH EPROM integrated circuit, according to the present invention, presents a negative voltage generator responsive to high positive programming potential $V_{PP}$ to supply a negative voltage.

According to one aspect of the present invention, the circuit for providing negative voltage is based on a charge pump driven by a periodic signal oscillating between essentially ground and a positive potential. The charge pump includes a first capacitor having a first terminal means receiving the positive periodic signal. The second terminal of the capacitor is clamped to a reference potential near ground, so that the second terminal does not rise above the reference potential. A switch, such as a diode connected transistor, coupled between the second terminal and an output node connects the second terminal to the output node when the voltage at the second terminal falls below the voltage on the output node, to pump the output node to a negative potential.

The periodic signal is generated by a voltage converter coupled to the high program potential $V_{PP}$, which converts a $V_{DD}$ level clock to the periodic signal.

The voltage converter is comprised basically of a diode drop circuit which allows adjustment of the voltage, and a high voltage inverter driven by the $V_{DD}$ level clock signal. The voltage drop circuit enables the designer to select a magnitude for the periodic signal, and thereby a magnitude of the negative voltage generated by the charge pump as suits the needs of a particular design. By using the high programming potential $V_{PP}$ in connection with the voltage converter, a very wide range of negative voltages is available, including negative voltage having an absolute value of greater than the input potential $V_{DD}$. Thus, in standard FLASH EPROM integrated circuits, in which the programming potential $V_{PP}$ is energized to a +12 volts during erase mode, and the chip power supply $V_{DD}$ is held at a +5 volts, a negative voltage may be generated which is more negative than −5 volts, as is explained in detail below.

According to yet another aspect of the present invention, the charge pump includes a first P-channel transistor with the source and drain coupled to the positive periodic signal configured as the input capacitor for the charge pump. A second P-channel transistor with the gate and drain coupled to ground and the source coupled to the gate of the first transistor is configured as a clamping diode. A third P-channel transistor is configured as a switching diode with the drain and gate coupled to the first transistor gate. An output node is coupled between the source of the third transistor and to ground.

The first P-channel transistor which is configured as the input capacitor, according to the preferred embodiment, is formed in an n-well which is connected to receive the periodic signal. This prevents high voltage from being accumulated across the gate of the first transistor during the negative voltage generation.

According to yet another aspect of the present invention, FLASH EPROM integrated memory circuit using the negative voltage generator in erase operations is provided. The memory circuit comprises K subarrays having M columns and N rows of floating gate storage transistors. The storage transistors in the subarrays have respective control gates, sources and drains. Addressing means is coupled to the K subarrays for generating address signals to access selective floating gate storage transistors. A plurality of wordlines is coupled to the control gates of the storage cells in respective rows.

A plurality of global bitlines is coupled to respective columns of cells. A plurality of local bitlines are coupled to the drains of the N storage cells in the respective column within a respective subarray. Means for selectively connecting the local bitlines in a subarray of storage cells to the corresponding global bitlines is provided and responsive to address signals. A plurality of local virtual ground lines are coupled to the sources of the N storage cells in respective columns within a respective subarray. Means for connecting the local virtual ground lines in a subarray of storage cells with a virtual ground terminal is provided. And columns select means, coupled to the global bitlines and the addressing means, selectively enables access to the N columns of storage cells in response to the address signals.

Finally, means which are coupled to the plurality of wordlines and the plurality of virtual ground lines, supply a negative gate erasing potential on selected wordlines and a positive voltage on virtual ground lines to remove charge in the floating gate of the selected floating gate storage transistors in response to the address signals during sector erase mode, and erase whole chip during chip erase mode.

Other aspects and advantages of the present invention can be seen upon review of the figures, the detailed description, and the claims which follow.

DETAILED DESCRIPTION OF THE PREFERRED EMBODIMENT

Figure 1:
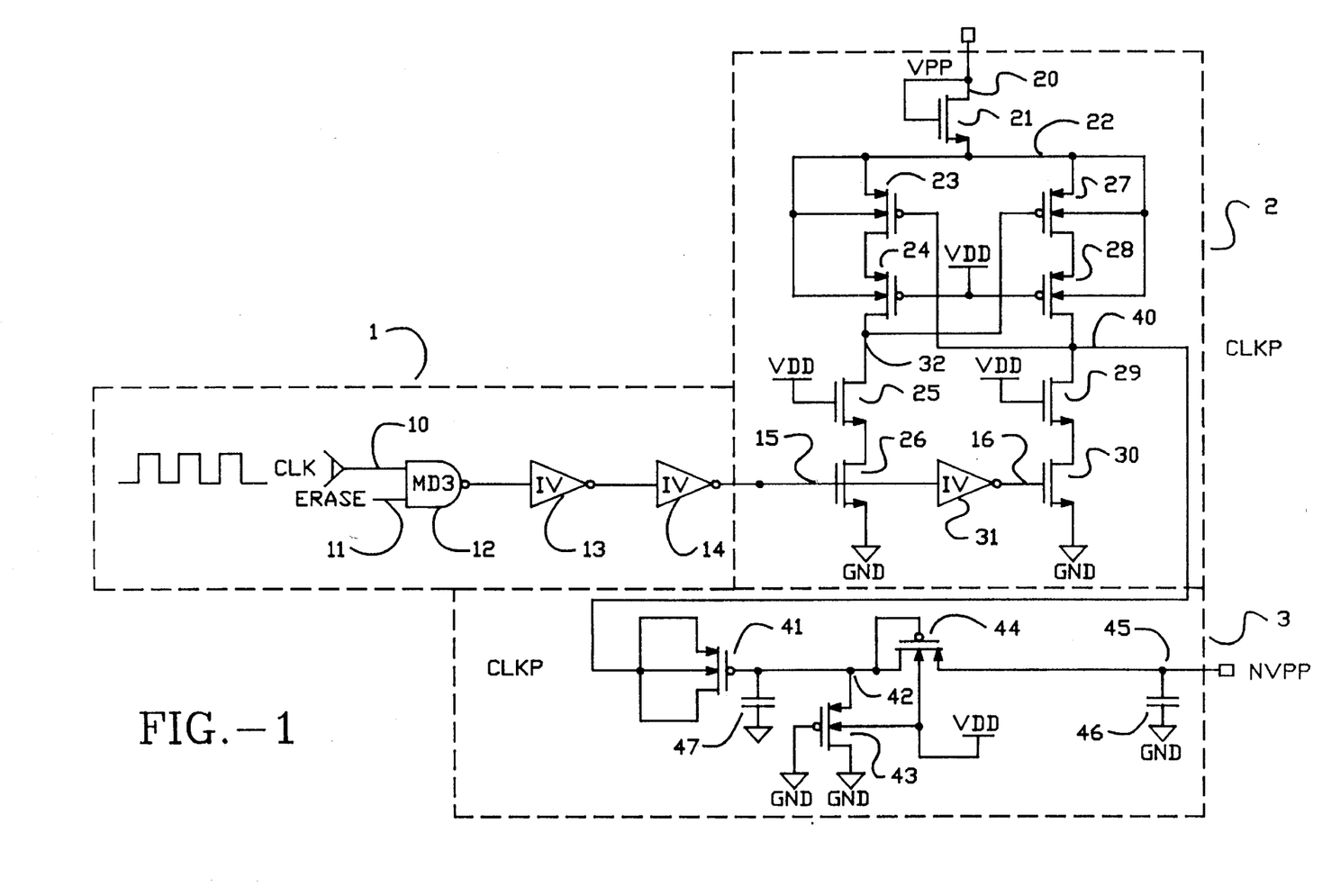
FIG. 1 is a schematic diagram for providing negative voltage from a positive voltage source according to the present invention.

FIG. 1 is a schematic diagram illustrating a circuit generating a negative voltage according to the present invention. The circuit in FIG. 1 consists generally of three sections: oscillator 1, voltage converter 2, and charge pump 3.

Oscillator 1 comprises NAND gate 12 and inverters 13 and 14. An ERASE signal, which is driven to the operating supply voltage $V_{DD}$ is applied during erase mode to NAND gate 12 on line 11. $V_{DD}$ (typically 5.0 ±0.5 volts) is generally a voltage supplied to FLASH EPROM memory during power-on operations. Oscillator signal CLK is applied to NAND gate 12 on line 10 allowing for NAND gate 12 to output a periodic signal through inverters 13 and 14 on line 15 which swings between essentially ground and $V_{DD}$.

The voltage converter receives the output on line 15 of the oscillator, and converts it to a periodic signal CLKP on line 40 which swings between a selected higher positive voltage and ground, such as 10.5 volts (which is $V_{PP}$-$V_{TN}$ of transistor 21) in the embodiment disclosed. The voltage converter is driven by the high programming potential $V_{PP}$, and includes a voltage drop circuit which consists essentially of the diode connected transistor 21, which generates a selected voltage on node 22. The value of the voltage on node 22 can be controlled as known in the art by including a string of diodes between $V_{PP}$ and node 22, or using other techniques as known in the art. The voltage on node serves as the high voltage for the periodic signal CLKP on line 40.

Transistors 23–30 and inverter 31 comprise basically a high voltage inverter which is driven by the periodic signal on line 15. Thus, a high positive voltage periodic signal on line 40 is supplied at the output of voltage converter 2. A charge pump 3 receives the periodic signal and generates a negative voltage NVPP on node 45. The charge pump includes an input capacitor composed in the preferred system of P-channel transistor 41 having its source and drain coupled to line 40, and its gate operating as an output node 42. The output node 42 is coupled across diode connected transistor 43 to ground, and across diode connected transistor 44 to the output node 45. An inherent output node capacitance 46 is shown connected between node 45 and ground. Node 42 inherently includes a parasitic capacitance, represented in the diagram by the element 47.

The input capacitor 41 couples the signal on line 40 to node 42. The diode connected transistor 43 clamps node 42 at a reference voltage about 1 P-channel threshold $|V_{TP}|$ above ground. Thus, on a rising edge of the signal CLKP on line 40, transistor 43 will clamp node 42 to about 1.3 volts.

The diode connected transistor 44 is non-conducting unless the voltage at node 42 falls below a threshold voltage of about 1.3 volts relative to node 45. Thus, on a falling edge of the signal CLKP on line 40, node 42 is decoupled to a negative potential and transistor 44 will conduct when node 42 falls about 1.3 volt below node 45. Thus, when node 42 is below node 45, transistor 44 turns on and injects charge into the output node capacitance 46, to pump the voltage in $V_{PP}$ negative. The equation of final voltage for signal NVPP is:

$$NVPP = -[(V_{PP} - V_{tn}) * C_R - 2 * |V_{tp}|]$$

where:

$V_{PP}$ = the input voltage;

$V_{tn}$ = the threshold voltage of N-channel type transistor 21 with "body effect" (about 1.5 V);

$V_{tp}$ = the threshold voltage of P-channel type transistor 43 or 44 with "body effect" (about −1.3 V);

$$C_R = C_{41} \div (C_{41} + C_{47})$$

where:

$C_{41}$ = the capacitance of transistor 41;

$C_{47}$=the line or parasitic capacitance.

Therefore, based on the above equation and as described in detail below, approximately −7.5±0.45 volts is outputted on node 45 as signal NVPP. The magnitude of NVPP can be adjusted by changing the number n of diodes in the diode string (n*|$V_{TN}$|) above node 22. Furthermore, the negative voltage is relatively precise without the requirement for complex voltage regulator circuitry.

The function of the voltage converter 2 is described in more detail as follow. In particular, $V_{PP}$ is applied to line 20 and is typically 12.0±0.6 volts during a program or erase mode. Line 20 is coupled to the drain of N-channel type transistor 21. Line 20 is also coupled to the gate of transistor 21 with the source coupled to line 22.

Line 22 is coupled to P-channel type transistors 23, 24, 27 and 28. Specifically, line 22 is coupled to the source of transistors 23 and 27. In addition, line 22 is coupled to the n-well of transistors 23, 24, 27 and 28 in order to prevent "body effect" voltage drops. The drain of transistor 23 is coupled to the source of transistor 24. Similarly, the drain of transistor 27 is coupled to the source of transistor 28.

Transistors 24 and 28 are provided for reducing the voltage stress across transistors 23 and 27 during transition. As described below, if transistors 24 and 28 were not included in the circuit, a source-to-drain voltage drop of 10.5 would alternately occur across transistors 23 and 27 during transition. This large of a voltage drop would cause a "soft breakdown" of transistors 23 and 27. In other words, the transistors would be operating beyond the "saturation" region in which voltage drops across a transistor's source/drain does not produce constant current. Beyond the "saturation" region, current increases exponentially rather than producing constant current.

$V_{DD}$ is coupled to the gates of transistors 24 and 28, while the gate of transistor 27 is coupled to line 32 and the gate of transistor 23 is coupled to line 40. This latch-like configuration allows 10.5 volts to be alternately applied to the gates of transistors 23 and 27, eliminating the DC current.

N-channel type transistors 25 and 29 are also coupled to lines 32 and 40, respectively. Line 32 is coupled to the drain of transistor 25 with the source of transistor 25 coupled to the drain of N-channel type transistor 26. $V_{DD}$ is coupled to the gate of transistor 25 and transistor 29. Line 40 is coupled to the drain of transistor 29 and the source of transistor 29 is coupled to the drain of N-channel type transistor 30. Finally, the sources of transistors 30 and 26 are coupled to a reference potential (ground). The gate of transistor 26 is coupled to line 15. The gate of transistor 30 is driven by line 16 at the output of inverter 31. The input to inverter 31 is line 15.

Transistors 25 and 29, as with transistors 24 and 28, are provided to eliminate "soft breakdown." Transistors 25 and 29 act as a voltage drop circuit preventing the full 10.5 volts on lines 32 or 40 to be applied across transistors 26 and 30 during transition. If the 10.5 volts on line 32 or 40 was directly applied to transistors 26 and 30, the transistors would undergo "soft breakdown."

The alternating conductivity of transistors 26 and 30 allow signal CLKP, in the present embodiment an approximately 10.5 volt periodic signal, to be outputted on line 40. Approximately, 10.5 volts is applied to line 22 based on a 1.5 volt drop $V_T$ voltage drop of transistor 21. This 10.5 volts will be periodically applied to line 40 when transistor 26 is conductive. When transistor 26 is in a conductive state, transistor 30 is in a non-conductive state allowing for the 10.5 volts on line 22 to pass through transistors 27 and 28 onto line 40. Alternatively, when transistor 30 is in a conductive state and transistor 26 is in a non-conductive state, CLKP is connected to ground through transistors 29 and 30. Accordingly, signal CLKP swinging between +10.5 volts and ground is outputted on line 40 to charge pump 3 which generates signal NVPP, in the present embodiment approximately −7.5 volts, on node 45. To achieve other values for NVPP, the amplitude of CLKP can be adjusted.

Line 40 is coupled to P-channel transistor 41 by connecting the n-well, source and drain to line 40 creating a capacitor. The n-well of transistor 41 is purposely tied to signal CLKP to reduce voltage stress across the transistor oxide which is typically 250Å. Tying signal CLKP to the n-well of transistor 41 allows the voltage across transistor 41 to be less than 10 volts, as seen in FIG. 2c. If the n-well of transistor 41 is not tied to signal CLKP and tied to $V_{PP}$, the voltage across transistor 41 would be beyond the breakdown voltage of transistor 41. The voltage stress of transistor 41, as seen in FIG. 3c, varies between −10 volts and −21 volts. This voltage is beyond the breakdown voltage of a 250Å gate-oxide transistor.

Figure 2A:
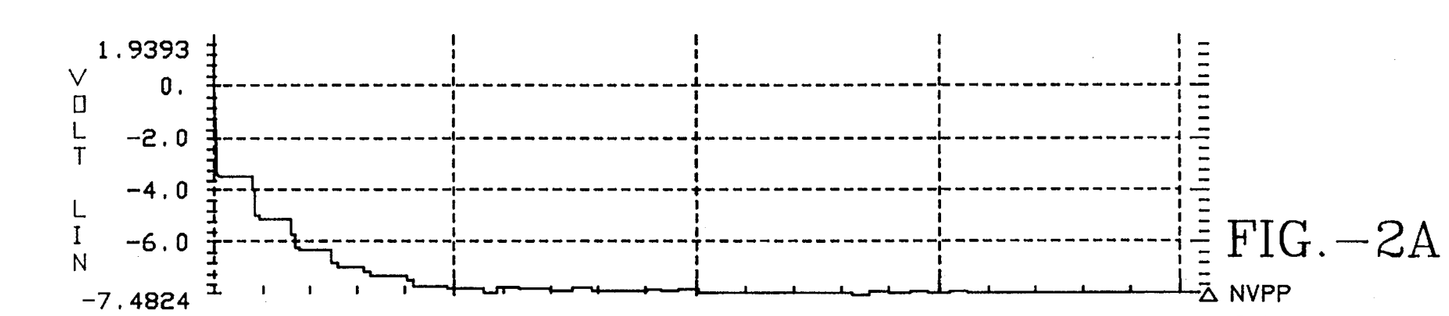
FIGS. 2a–c are HSPICE simulation results of the schematic in FIG. 1 according to the present invention.
Figure 2B:
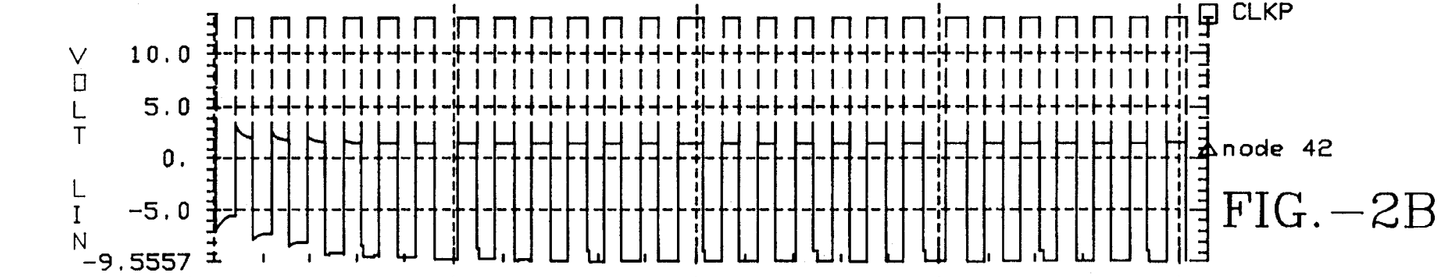
Figure 2C:
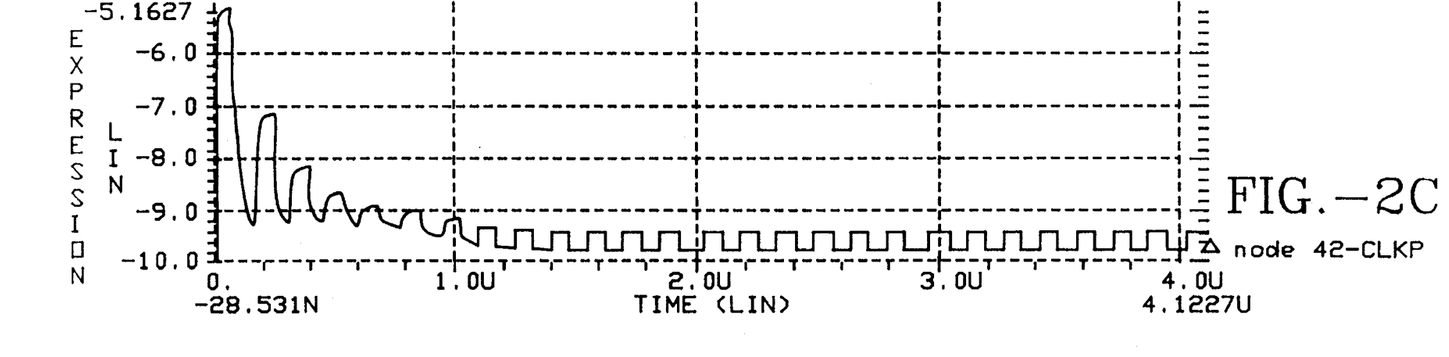

The timing diagram associated with the charge pump 3 in FIG. 1 can be seen in FIGS. 2a–c. FIG. 2a shows the output at node 45 or signal NVPP. FIG. 2b illustrates the voltages at node 42 as depicted by bold lines and signal CLKP illustrated by dashed lines. Finally, FIG. 2c shows the difference in voltage between node 42 and line 40 or the voltage stress across transistor 41. The operation of charge pump 3 in FIG. 1 along with its timing diagram in FIGS. 2a–c will now be described. Signal CLKP from voltage converter 2 is a periodic signal with an amplitude of approximately 10.5 volts and a reference voltage level of approximately 0 volts. At time $T_0$, signal CLKP is 0 volts, node 42 is approximately 1.3 volts and NVPP is approximately 2 volts due to connections to other circuitry not shown. The approximate 1.3 volts at node 42 is equal to the absolute value of the threshold voltage of transistor 43. At time $T_1$, signal CLKP transitions from 0 volts to 10.5 volts and thus 10.5 volts is applied to transistor 41. Transistor 41 is capacitor configured (10 picofarads in this simulation). In addition to the capacitance associated with transistor 41, there is inherent parasitic capacitance illustrated by element 47. The output node is around 20 picofarads in this simulation. Typically, capacitor element 47 is on the order of less than 0.5 picofarads. Transistor 41 and capacitor element 47 act as two capacitors in series coupled between a 10.5 volt source and ground potential. Based upon these capacitance values, transistor 41 and capacitor element 47 create a coupling ratio on node 42 of approximately 95%. The 95% number is derived by the equation $C_{41}/(C_{41}+C_{47})$ set out above. Accordingly, 95% of the 10.5 volts or approximately 10 volts is supplied to node 42. The positive voltage at node 42 is quickly clamped to the 1.3 voltage threshold drop of transistor 42 being a diode coupled to a ground potential source. At time $T_2$, the 10.5 volts of signal CLKP transitions to 0 volts. Accordingly, node 42 undergoes a −10 voltage drop as seen in FIG. 2b. As the voltage on node 42 follows the falling edge of signal CLKP a negative voltage is established at node 42. With a negative voltage now on node 42, transistor 44 is turned on allowing the negative voltage of node 42 to charge the output node. Likewise, with the falling edge of each 10.5 volt pulse to node 42, the voltage difference across transistor 44 is slowly decreased until about −7.5 volts is reached at node 45.

Figure 3A:
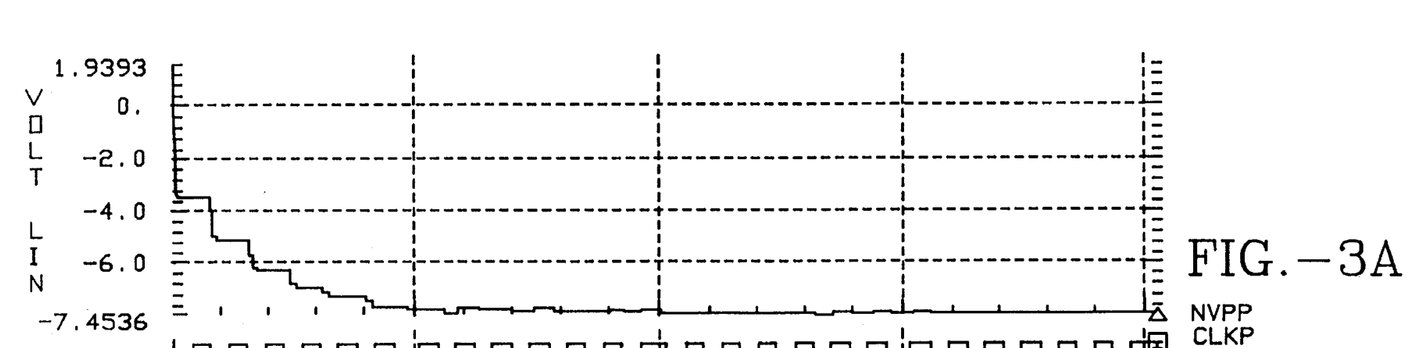
FIGS. 3a–c are HSPICE simulation results of the schematic in FIG. 1 when the n-well of transistor 41 is coupled to $V_{PP}$.
Figure 3B:
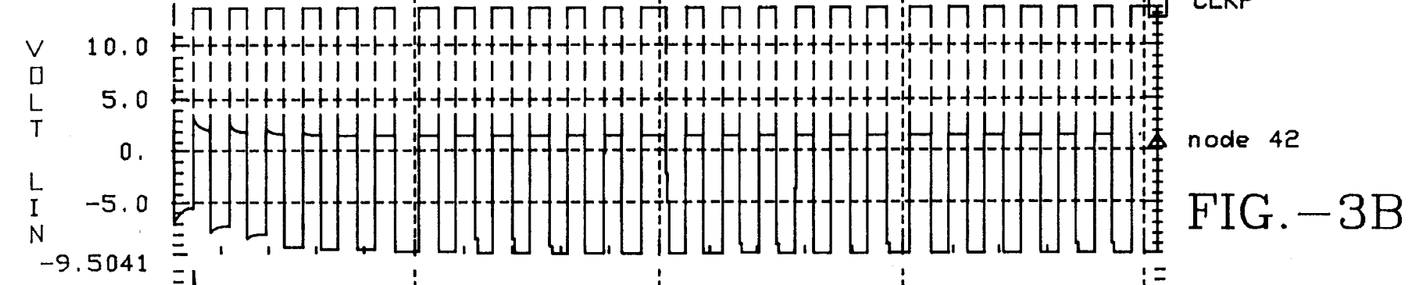
Figure 3C:
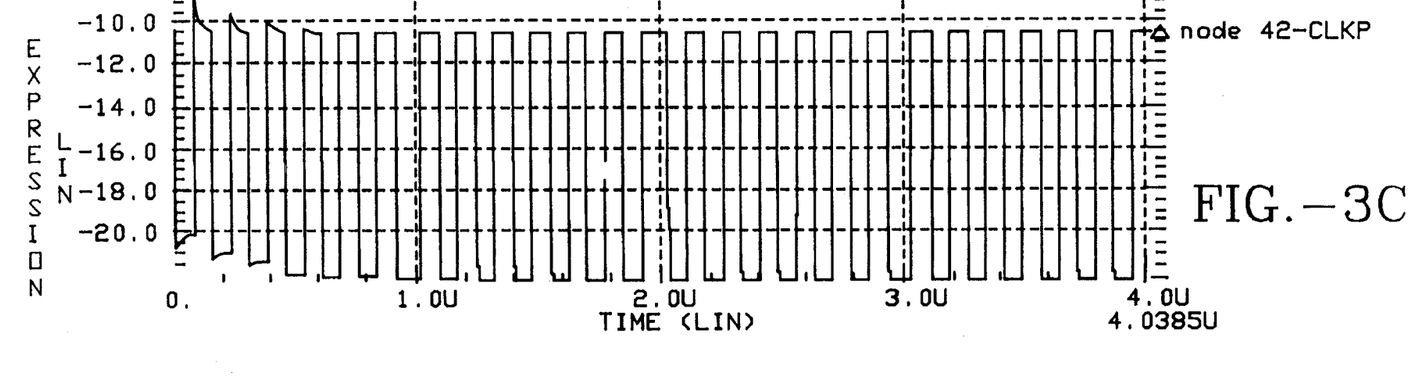

FIGS. 3a–c are timing diagrams of FIG. 1 with the n-well of transistor 41 tied to $V_{PP}$. As can be seen, FIGS. 3a and 3b are substantially the same as FIGS. 2a and 2b. By tying the n-well of transistor 41 to $V_{PP}$, signal NVPP and the voltage at node 42 are still approximately the same as in FIGS. 2a and 2b. However, the voltage stress across transistor 41 as shown by the timing diagrams in FIGS. 2c and 3c are substantially different. The voltage stress exhibited in FIG. 3c ranges from −10 to −21 volts while the voltage in FIG. 2c never exceeds −10.0 volts. The voltage range in FIG. 3c is beyond the breakdown voltage of transistor 41. Accordingly, tying the n-well of transistor 41 to signal CLKP reduces voltage stress and eliminates the breakdown of transistor 41.

Figure 4:
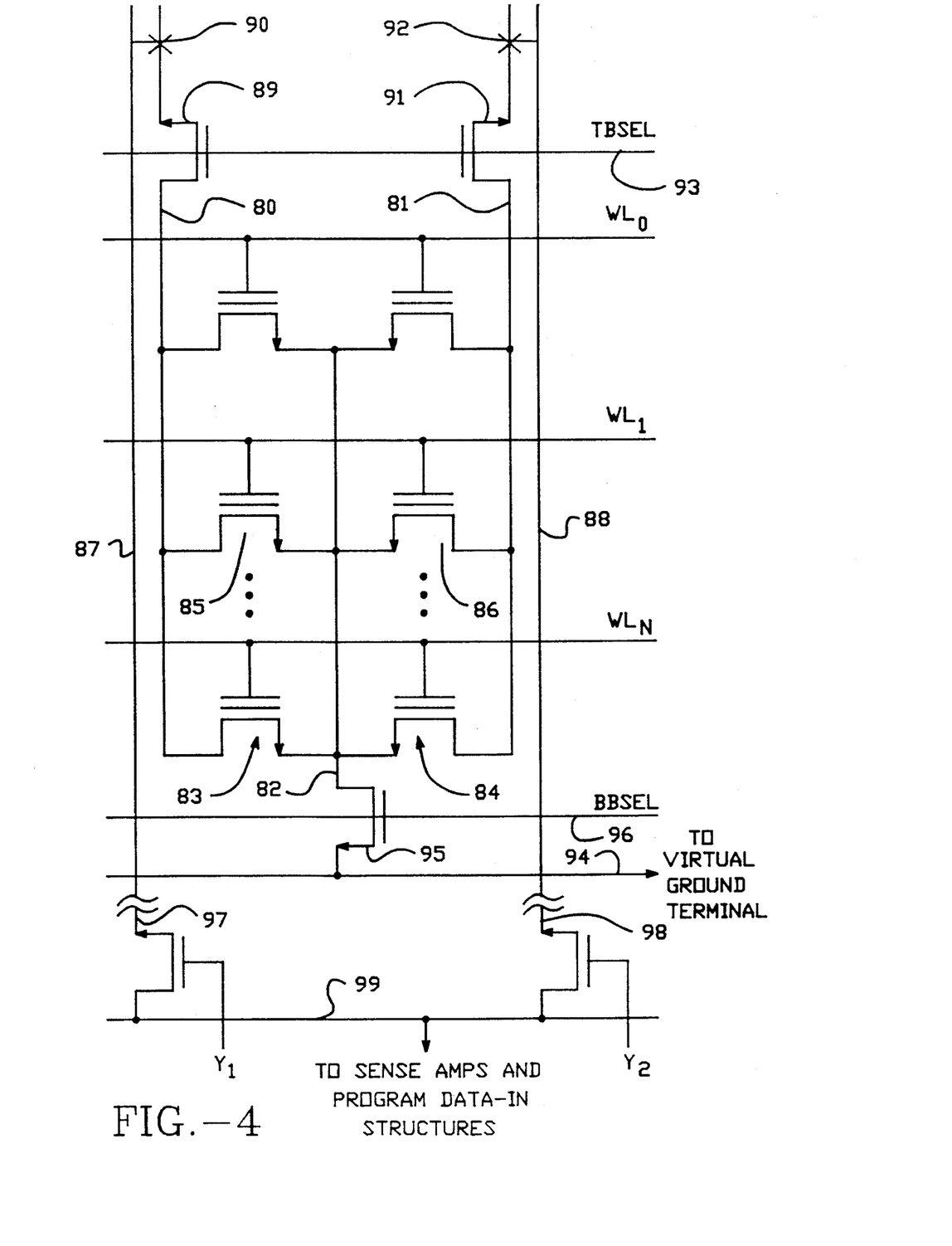
FIG. 4 is a schematic diagram of a FLASH EPROM circuit according to the present invention.

FIG. 4 illustrates the drain-source-drain configuration of the FLASH EPROM circuit according to the present embodiment. More details of the memory design are provided in the above cross-referenced application, Ser. No. 07/823,882. The circuit includes a first local bitline 80 and a second local bitline 81. The first and second local bitlines 80, 81 are implemented by buried diffusion conductors as described below. Also included is a local virtual ground line 82 implemented by buried diffusion. A plurality of floating gate transistors having gates, drains and sources are coupled to the local bitlines 80, 81 and local virtual ground line 82. The sources of the plurality of transistors are coupled to the local virtual ground line 82. The drains of a first column of transistors, generally 83, are coupled to the first local bitline 80, and the drains of a second column of transistors, generally 84, are coupled to the second local bitline 81. The gates of the floating gate transistors are coupled to wordlines $WL_0$ through $WL_N$, where each wordline (e.g., $WL_1$) is coupled to the gate of a transistor (e.g., transistor 85) connected to the first local bitline 80 and a transistor (e.g., transistor 86) connected to the second local bitline 81. Thus, transistors 85 and 86 can be considered a two transistor cell with a shared source diffusion.

The act of charging the floating gate is called the program step for the FLASH EPROM cell. This is accomplished through hot electron injection by establishing a large positive voltage between the gate and the source, such as 12 volts, and a positive voltage between the drain and the source, such as 7 volts.

The act of discharging the floating gate is called the erase step for the FLASH EPROM cell. This is accomplished through the F-N tunneling mechanism between the floating gate and the source (source erase) or between the floating gate and the substrate (channel erase). The source erasing is performed by applying a positive bias to the source, seven volts, while the gate is negatively biased, such as −7.5 volts. The channel erasing is performed by applying a negative bias to the gate and/or a positive bias to the substrate.

Accordingly, signal NVPP of FIG. 1 is applied to the floating gates by way of $WL_0$ through $WL_N$ while a positive voltage ranging from around 5.5 to 8.0 volts is applied to line 82 in order to allow for erasing of the FLASH EPROM cell. Using a relatively large negative wordline voltage, such as signal NVPP at −7.5 volts, "hot hole trapping" is alleviated and the array $V_{SS}$ voltage level is reduced.

A first global bitline 87 and a second global bitline 88 are associated with each drain-source-drain block as shown in FIG. 4. The first global bitline 87 is coupled to the source of top block select transistor 89 through a metal-to-diffusion contact 90. Similarly, the second global bitline 88 is coupled to the source of top block select transistor 91 through a metal-to-diffusion contact 92. The drains of the top block select transistors 89, 91 are coupled to the first and second local bitlines 80 and 81, respectively. The gates of the top block selector transistors 89, 91 are controlled by a top block select signal TBSEL on line 93.

The local virtual ground line 82 is coupled to a virtual ground terminal across conductor 94 through bottom block selector transistor 95. The drain of the bottom block select transistor 95 is coupled to the local virtual ground line 82. The source of the bottom block select transistor 95 is coupled to the conductor 94. The gate of the bottom block select transistor 95 is controlled by a bottom block select signal BBSEL across line 96. During erase, conductor 94 is at 7 volts and when the bitline is selected, the corresponding BBSEL is at 12 volts to pass 7 volts to local source line 82. In the preferred system, the conductor 94 is a buried diffusion conductor which extends to a metal-to-diffusion contact at a position displaced horizontally through the array, which provides contact to a vertical metal virtual ground bus.

The global bitlines extend vertically through the array to respective column select transistors 97, 98, through which a selected global bitline is coupled to sense amps and program data-in circuitry (not shown). Thus, the source of column select transistor 97 is coupled to global bitline 87, the gate of column select transistor 97 is coupled to a column decode signal $Y_1$, and the drain of the column select transistor 97 is coupled to conductor 99.

Figure 5:
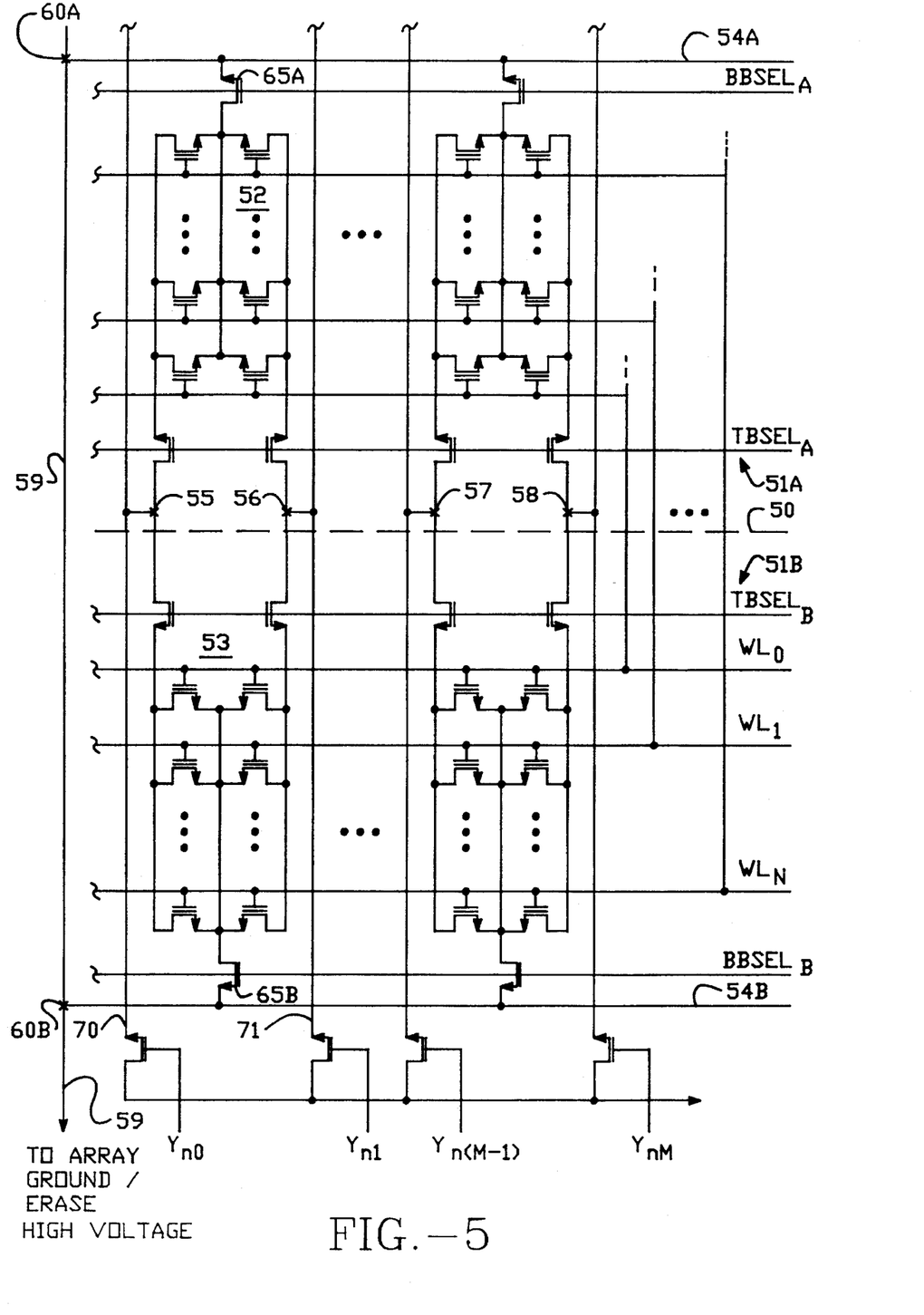
FIG. 5 is a schematic diagram illustrating the layout of two subarrays of FLASH EPROM cells according to the present invention.

The blocks of FLASH EPROM cells as shown in FIG. 4 are configured into a plurality of subarrays as illustrated in FIG. 5. FIG. 5 illustrates two subarrays within a larger integrated circuit. The subarrays are divided generally along dotted line 50 and include subarray 51A generally above the line 50 and subarray 51B generally below the line 50. A first block 52 is laid out in a mirror image with a second block 53 along a given bitline pair (e.g., bitlines 70, 71). As one proceeds up the bitline pair, the memory subarrays are flipped so as to share virtual ground conductors 54A, 54B (buried diffusion) and metal-to-diffusion contacts 55, 56, 57, 58. The virtual ground conductors 54A, 54B extend horizontally across the array to a vertical virtual ground metal line 59 through metal-to-diffusion contacts 60A, 60B. The subarrays repeat on opposite sides of the metal virtual ground line 59 so that adjacent subarrays share a metal virtual ground line 59. The metal virtual ground line 59 is coupled to array ground and erase high voltage circuitry. Thus, the subarray layout requires two metal contact pitches per column of two transistor cells for the global bitlines and one metal contact pitch per subarray for the metal virtual ground line 59.

Furthermore, two subarrays as illustrated in FIG. 5 may share wordline signals because of the additional decoding provided by the top and bottom block select signals TBSELA, TBSELB, BBSELA, and BBSELB.

In one preferred system, each subarray includes 8 blocks 32 two transistor cells and wordlines deep, so that there are a total of 16 global bitlines and 32 wordlines, providing a 512 cell subarray.

As can be seen, the architecture according to the present invention provides a sectored FLASH EPROM array. This is beneficial because the source and drain of transistors in non-selected subarrays during a read, program or erase cycle may be isolated from the currents and voltages on the bitlines and virtual ground lines. Thus, during a read operation, sensing is improved because leakage current from subarrays not selected does not contribute to current on the bitlines. During the program and erase operations, the high voltages of the virtual ground line, and the bitlines, are isolated from the unselected blocks. This allows a sectored erase operation.

It will be appreciated that the bottom block select transistors (e.g., transistors 65A, 65B) may not be necessary in a given implementation. Also, these block select transistors may share a bottom block select signal with an adjacent subarray, as illustrated below with respect to FIG. 5. Alternatively, the bottom block select transistors (e.g., 65A, 65B) may be replaced by single isolation transistors adjacent the virtual ground terminals 60A, 60B.

Figure 6:
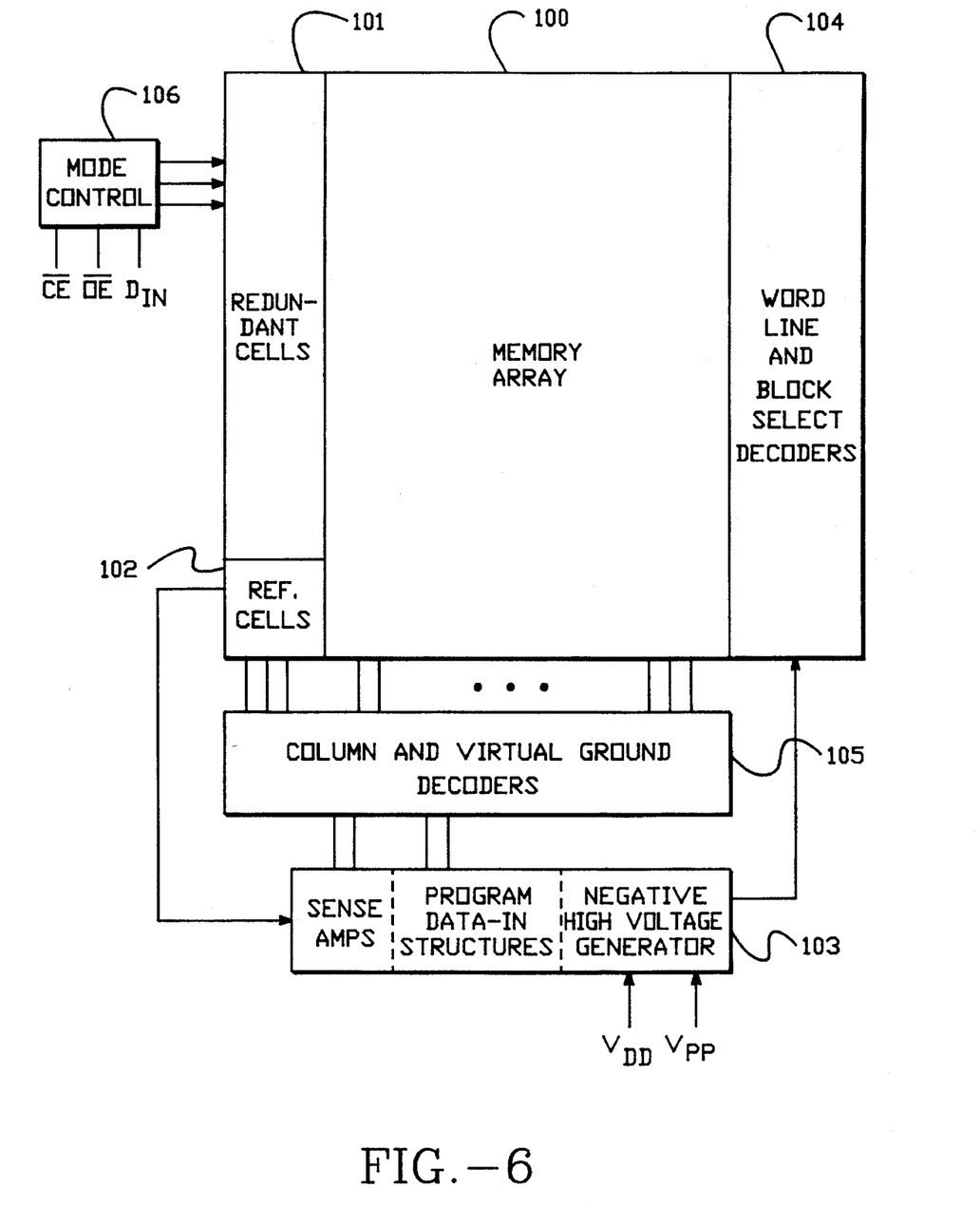
FIG. 6 is a block diagram of a FLASH EPROM integrated circuit according to the present invention.

FIG. 6 is a schematic block diagram of a FLASH EPROM integrated circuit according to the present invention. The FLASH EPROM includes a memory array 100 implemented as shown in FIG. 5. A plurality of redundant cells 101 is implemented in the preferred system so that any failed cells in the memory array may be replaced by redundant cells 101. In addition, the circuit includes a plurality of reference cells 102, block 103 which includes sense amps, program data-in circuits, and negative high voltage generator, and block 104 which includes wordline and block select decoders, and block 105 which includes column decoders and virtual ground decoders.

The circuit of FIG. 1 which provides negative voltage for erasing memory array 100 is found in the negative high voltage generator in block 103. $V_{DD}$ and $V_{PP}$ are applied to the negative high voltage generator allowing for the negative voltage provided by the circuit of FIG. 1 to be applied through wordlines to individual memory cells in memory array 100.

The reference cells 102 may also be used in the generation of program and read voltages. This redundant cell architecture is made possible by the segmented architecture of the FLASH EPROM arrays as discussed above.

The wordline and block select decoders 104 and the column and virtual ground decoder 105 are programmable after testing so that redundant cells may replace inoperable cells in the memory array 100.

In addition, the circuit includes a mode control circuit 106 responsive to the chip enable $\overline{CE}$, output enable $\overline{OE}$, and data-in $D_{IN}$ signals for the chip. The circuit 106 controls the erase, program and read operations, and the virtual ground, drain and wordline voltages used during the various operations. This circuit may be implemented for instance as in U.S. Pat. No. 5,053,990 to Kreifels, et al.

In conclusion, a circuit for providing a negative voltage to the wordlines or floating gates of a plurality of FLASH EPROM cells is provided. The circuit comprises an oscillator and voltage converter using the $V_{PP}$ voltage source to produce a CLKP signal. CLKP signal is a periodic signal, coupled to a charge pump comprising three transistors producing the negative voltage in response to CLKP signal. The first transistor acts as a capacitor. The second transistor and third transistor act as a diode switch supplying a negative voltage to the output node.

The foregoing description of preferred embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical application, thereby enabling others skilled in the art to understand the invention for various embodiments and with various modifications as are suited to the particular use contemplated. It is intended that the scope of the invention be defined by the following claims and their equivalents.

What is claimed is:

1. A FLASH EPROM integrated memory circuit receiving a supply voltage $V_{cc}$ for read operations and a programming potential $V_{PP}$ for programming operations, comprising:

an array of FLASH EPROM storage transistors, storage transistors in the array having respective floating gates, sources and drains;

addressing means, coupled to the array, for generating address signals to access selected storage transistors;

a plurality of wordlines, coupled to the floating gates of storage cells in respective rows;

a plurality of bitlines, coupled to drains of storage cells in respective columns;

a plurality of local virtual ground lines, each coupled to the sources of storage cells in respective columns;

means for connecting the local virtual ground lines in the array of storage cells with a virtual ground terminal;

means, coupled to the plurality of wordlines and the plurality of virtual ground lines, for supplying a negative gate erasing potential on wordlines and a positive voltage on virtual ground lines, to remove charge in the floating gates of selected storage transistors, said means for Supplying a negative gate erasing potential including a negative voltage generator, responsive to the programming potential $V_{PP}$, to generate the negative erasing potential on an output node, said negative voltage generator including, a positive high voltage input to receive $V_{PP}$;

a voltage converter, coupled to the positive high voltage input and the clock driver to convert the clock signal to a positive periodic signal having a particular amplitude different than $V_{CC}$; and a charge pump, coupled to voltage converter, for generating negative voltage on the output node in response to the positive periodic signal.

2. The circuit of claim 1, wherein the charge pump includes:

a first capacitor having a first terminal and a second terminal, the first terminal coupled to the voltage converter to receive the positive periodic signal;

a clamp circuit, coupled to the second terminal of the first capacitor, to clamp the second terminal to less than or equal to a maximum potential; and a switch, coupled between the second terminal of the first capacitor and the output node, having a conductive state when voltage on the second terminal of the first capacitor falls below voltage on the output node.

3. The circuit of claim 2, wherein the first capacitor comprises:

a capacitor configured transistor having a source and drain coupled to the first terminal of the first capacitor and a gate coupled to the second terminal of the first capacitor.

4. The circuit of claim 3, wherein the capacitor configured transistor consists of a p-channel MOS transistor, including an n-well coupled to the first terminal of the first capacitor.

5. The circuit of claim 2, wherein the clamp circuit comprises:

a diode configured transistor, coupled between the second terminal of the first capacitor and ground.

6. The circuit of claim 2, wherein the switch comprises:

a diode configured transistor, coupled between the second terminal of the first capacitor and the output node.

7. A memory device circuit coupled to receive a supply voltage and coupled to receive a programming potential for programming operations, said memory device circuit comprising:

a plurality of storage transistors forming an array, a storage transistor in said plurality of storage transistors has a corresponding gate, source and drain, said array including a plurality of local virtual ground lines;

an addressing circuit, coupled to said plurality of storage transistors, having an address signal output, wherein an address signal selects a predetermined storage transistor of said plurality of storage transistors;

a plurality of wordlines, a wordline of said plurality of wordlines being coupled to at least a first gate in a first row of said array;

a plurality of bitlines, a bitline of said plurality of bitlines being coupled to at least a first drain in a first column of said array;

a circuit for selectively electrically coupling a virtual ground terminal and said plurality of local virtual ground lines, said circuit further for selectively electrically coupling said plurality of local virtual ground lines to a positive voltage; and a negative voltage generator circuit having a negative gate erasing voltage output, said negative gate erasing voltage output being coupled to said plurality of wordlines, wherein a negative gate erasing voltage is generated in response to said programming potential, said negative voltage generator circuit including, a clock driver having a clock signal output, a clock signal having an amplitude corresponding to said supply voltage, said clock signal being periodic, a voltage converter, coupled to receive said programming potential and said clock signal, having a converted clock signal output, a converted clock signal having a different amplitude than said supply voltage, and a charge pump, coupled to receive said converted clock signal, for generating said negative gate erasing voltage in response to said converted clock signal.

8. The memory device circuit of claim 7 wherein said charge pump includes:

a first capacitor having a first terminal and a second terminal, said first terminal coupled to receive said converted clock signal, a clamp circuit, coupled to said second terminal, to clamp a potential at said second terminal to less than or equal to a maximum potential, and a switch, coupled between said second terminal and an output node, being conductive when said potential at said second terminal differs from a potential at said output node by a predetermined amount.

9. The memory device circuit of claim 8 wherein said first capacitor includes a configured transistor having a first source and a first drain coupled to said first terminal and a first gate coupled to said second terminal.

10. The memory device of claim 8 wherein said clamp circuit includes a diode configured transistor coupled between said second terminal and a ground.

11. The memory device of claim 8 wherein said switch includes a diode configured transistor coupled between said second terminal and said output node.

12. The memory device of claim 7 wherein said memory device includes a FLASH EPROM circuit.

13. A method of using a first circuit in an memory device, said memory device being coupled to receive a supply voltage and a programming voltage, said memory device including, an array of transistors, each transistor in said array of transistors having a source, a drain, and a gate, an addressing circuit coupled to said array of transistors, a plurality of wordlines being coupled to gates in said array, a plurality of bitlines being coupled to drains in said array, a plurality of local virtual ground lines coupled to sources in said array, a circuit for electrically coupling a virtual ground terminal and said plurality of local virtual ground lines, said first circuit including a negative voltage generator, said negative voltage generator including a charge pump, said first circuit coupled to said plurality of wordlines and said plurality of local virtual ground lines, and said method comprising the steps of, in response to receiving a first programming potential, performing the following steps:

said negative voltage generator generating a negative erasing voltage on said plurality of wordlines using said charge pump;

said first circuit causing a positive voltage on said plurality of local virtual ground lines; and discharging charge from at least a first transistor of said array of transistors.

* * * * *